(12) United States Patent
Hashimoto

(10) Patent No.: US 7,554,833 B2
(45) Date of Patent: Jun. 30, 2009

(54) SEMICONDUCTOR MEMORY AND METHOD OF WRITING DATA INTO THE SEMICONDUCTOR MEMORY

(75) Inventor: Keiichi Hashimoto, Yokohama (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 98 days.

(21) Appl. No.: 11/907,827

(22) Filed: Oct. 17, 2007

(65) Prior Publication Data

US 2008/0144359 A1    Jun. 19, 2008

(30) Foreign Application Priority Data

Dec. 18, 2006  (JP) ............................... 2006-339635

(51) Int. Cl.
*G11C 7/00* (2006.01)
(52) U.S. Cl. .................................... 365/149; 365/185.1
(58) Field of Classification Search ................ 365/149, 365/185.1; 257/300
See application file for complete search history.

(56) References Cited

U.S. PATENT DOCUMENTS 6,841,821 B2 * 1/2005 Hsu ........................... 257/305
7,042,052 B2 * 5/2006 Bhattacharyya ............. 257/347

FOREIGN PATENT DOCUMENTS

| JP | 2002-184873 A | 6/2002 |
| JP | 2005-064295 A | 3/2005 |
| JP | 2005-116667 A | 4/2005 |
| WO | WO 01/17018 A1 | 3/2001 |

OTHER PUBLICATIONS

"4-bit per Cell NROM Reliability", B. Eitan et al., IEEE International Devices Meeting 2005, IEDM Technical Digest, pp. 539-542.

* cited by examiner

*Primary Examiner*—Vu A Le
(74) *Attorney, Agent, or Firm*—Rabin & Berdo, PC.

(57) ABSTRACT

A non-volatile semiconductor memory including a silicon substrate having first and second diffusion layers at its surface and a control gate located above a channel region defined by the first and the second diffusion layers and formed on the silicon substrate. The memory further includes first, second and third capacitors are formed on the channel region, respectively under the control gate, on one side of the control gate and the first capacitor and at the opposite side of the control gate and first capacitor.

20 Claims, 9 Drawing Sheets

SEMICONDUCTOR MEMORY AND METHOD OF WRITING DATA INTO THE SEMICONDUCTOR MEMORY

CROSS-REFERENCE TO RELATED APPLICATION

This application claims the priority benefit of Japanese Patent Application No. 2006-339635 filed Dec. 18, 2006, the entire disclosure of which is incorporated herein by reference.

BACKGROUND OF THE INVENTION

1. Field of the Invention

The invention relates to a semiconductor memory and a method of writing data into the semiconductor memory, and specifically, relates to a nonvolatile semiconductor memory that can store a plurality of data in a single memory cell, and a method for of writing such data in the nonvolatile semiconductor memory.

2. Description of the Related Art

As described in a reference (1) [patent publication JP 2002-184873A], one of the latest nonvolatile. semiconductor memory employs an SONOS (Silicon/Oxide/Nitride/Oxide/Silicon) structure. With reference to FIG. 7, a structure and an operation of a conventional nonvolatile semiconductor memory having an SONOS structure are explained as follows. FIG. 7 is a sectional view showing a skeleton framework of a single memory cell structure in a nonvolatile semiconductor memory having an SONOS structure (hereinafter called "a SONOS memory" 110).

The SONOS memory 110 includes a tunnel oxide layer 132, a capacitor layer 134 formed on the tunnel layer 132 and a top oxide layer 136 formed on the capacitor layer 134. These layers 132, 134, 136 are formed on a silicon substrate 120 in an active region defined by unillustrated isolation regions.

The SONOS memory 110 further includes a control electrode 150 formed on the top oxide layer 136. At a main surface 120a of the silicon substrate 120, first and second impurity diffusion layers 124a and 124b are formed, and the first and second impurity diffusion layers 124a and 124b sandwich an area (hereinafter called "a channel region") at the main surface under the control gate 150. The first and second impurity diffusion layers 124a and 124b act as a source and a drain, respectively.

In the SONOS memory 110, the existence of information depends on a condition whether or not electrons are stored in the capacitor layer 134. That is, it is recognized that information is stored when electrons are stored in the capacitor layer 134. Since such a capacitor layer 134 can store electrons locally, electrons can be stored in the capacitor layer 134 in an area close to the first impurity diffusion layers 124a (e.g. drain), by generating hot carriers in an area of the channel region under the control gate close to the first impurity diffusion layers 124a. On the other hand, when hot carriers are generated in another area of the channel region under the control gate close to the second impurity diffusion layers 124b (e.g. source), electrons can be stored in the capacitor layer 134 in another area close to the source 124b. In other words, electrons can be stored in the capacitor layer 134 in either area adjacent to the drain or the source. Thus, in the SONOS memory 110, two-bit information can be stored in each single memory cell.

There is another type of a nonvolatile semiconductor memory (other than the SONOS memory 110) now available, namely a sidewall-type memory. A sidewall-type memory is disclosed in a reference (2) [patent publication JP 2005-64295A]. With reference to FIG. 8, a structure and an operation of a conventional sidewall-type memory 210 are explained as follows. FIG. 8 is a sectional view showing a skeleton framework of a single memory cell in the sidewall-type memory 210.

The sidewall-type memory 210 includes a silicon substrate 220 and a MOSFET on the substrate 220. The MOSFET includes a control gate 250, first and second impurity diffusion layers 224a and 224b, and first and second variable resistive layers 222a and 222b. The control gate is formed on a gate oxide layer 232 on an area sandwiched by the first and the second impurity diffusion layers 224a and 224b.

The first and the second impurity diffusion layers 224a and 224b sandwich the first and the second variable resistive layers 222a and 222b, the N$^+$ impurities are diffused therein, respectively. The first and the second impurity diffusion layers 224a and 224b act as a source and a drain of the MOSFET. In the following explanation, the first impurity diffusion layer 224a is treated as a drain, and the second impurity diffusion layer 224b is treated as a source.

Each of the first and the second variable resistive layers 222a and 222b is formed in the substrate on its main surface 220a between the one of the source and drain 224a and 224b and the area under the control gate. In both of the first and the second variable resistive layers 222a and 222b, as well as the source and drain 224a and 224b, N type impurities are diffused. The impurity concentration in each of the first and the second variable resistive layers 222a and 222b is lighter than that of the source and the drain 224a and 224b. Thus, each of the first and the second variable resistive layers 222a and 222b is defined as an N$^-$ diffusion layer while each of the source 224b and the drain 224a is defined as an N$^+$ diffusion layer.

In the sidewall-type memory 210, a first capacitor 240a is formed on the first variable resistive layer 222a, and a second capacitor 240b is formed on the second variable resistive layer 222b. The first capacitor 240a includes a tunnel oxide layer 242a, a capacitor layer 244a formed the tunnel oxide layer 242a and the top oxide layer 246a formed on the capacitor layer 244a. The second capacitor 240b is a similar to the first capacitor 240a, that is, it includes a tunnel oxide layer 242b, a capacitor layer 244b formed the tunnel oxide layer 242b and the top oxide layer 246b formed on the capacitor layer 244b.

In the sidewall-type memory 210, while a resistance value of the first variable resistive layer 222a is changed according to whether or not electrons are stored on the first capacitor 240a, a resistance value of the second variable resistive layer 222b is changed by according to whether or not electrons are stored on the second capacitor 240b. It is called "1" herein when electrons are stored in the first and second capacitors 240a and 240b, and "0" when electrons are not stored, in order to distinguish between the existence of data and the non-existence of data.

Injection of electrons into the first capacitor 240a is made as follows. Initially, the source 224b and the silicon substrate 110 are grounded. Then a positive voltage is applied to the control gate 250 and the drain 224a. Under this condition, the electrons that have passed through in the channel are changed to a high energy state near the drain 224a by the strong electric field toward the drain 224a. The electrons in the high energy state collide with atoms of the silicon substrate located near the electrons. As a result of the collisions, electron-hole pairs are generated. The electrons generated in this way, whose potential barrier $\phi$B is greater than that (~3.2 eV) at the interface junction between the silicon substrate 220 and the tunnel oxide layer 242, known as "hot electrons", are injected into the first capacitor layer 244a by an electric field toward the gate electrode 250.

To read out the information stored in the first capacitor 240a, initially, the silicon substrate 220 and the drain 224a are grounded, and then a positive voltage is applied to the control gate 250 and the source 224b. When the electrons are stored in the first capacitor 240a, the electrons stored in the first capacitor 240a induce positive charges at the first variable resistive layer 222a, which is located immediately beneath the first capacitor 240a. As a result of the inducement of positive charges, the resistance value of the first variable resistive layer 222a is increased. Thus, the electric current between the source 224b and drain 224a (channel current) is reduced. On the other hand, when the electrons are not stored in the first capacitor 240a, the resistance value of the first variable resistive layer 222a is not increased. Thus, the channel current is not reduced. Whether or not the electrons are stored is determined by the amount of the electric current. In other wards, two conditions that are the existence of data "1", which is expressed by a small channel current flow, and the non-existence of data "0", which is expressed by a large channel current flow, are distinguished.

As with the SONOS memory 110, it is possible to store two-bit information in each single memory cell in the sidewall-type memory 210, by switching the voltages applied between the source 224b and drain 224a.

In recent years, the technologies have been further improved. As described above, two-bit information can be stored in each single memory cell in both the sidewall-type memory 210 and the SONOS memory 110. But, as shown in references (3) and (4) [patent publication WO 01/170/BA1 and patent publication JP 2005-116667A], new technologies, which can increase information in a single memory cell, have been introduced.

A semiconductor memory disclosed in reference (3) includes eight (8) areas where information can be stored in a single memory cell so that eight-bit information can be stored. Data for each bit is stored in the following way. Initially, two diffusion layers are selected from five diffusion layers. Then, one of the selected two layers is defined as a drain, and the other is defined as a source.

A semiconductor memory disclosed in reference (4) includes a first active area and a second active area, which intersect at a cross region with the first active area. Each of the first and second active areas includes two diffusion layers. Each of the two layers are located in one of the areas that sandwich the cross region. Therefore, the semiconductor memory disclosed in reference (4) includes four (4) areas where information can be stored in a single memory cell so that four-bit information can be stored.

However, the semiconductor memory disclosed in references (3) and (4) requires four or five-bit lines for each cell, each of which is voltage-controlled independently, so that metalized wirings may be complicated.

Furthermore, as shown in reference (5) (Non-patent publication titled "4-bit per Cell NROM Reliability", B. Eitan et al., IEEE International Devices Meeting 2005, IEDM Technical Digest, pp. 539-542), it is proposed that data be stored in each side of one memory cell by controlling the amount of electrons injected into each side of the memory cell. According to this technology, four conditions are generated, including a first condition (A) that no electrons are injected, a second condition (B) that small amount of electrons is injected, a third condition (C) that a large amount of electrons is injected, and a fourth condition (D) that a further amount of electrons is injected. By generating the four conditions, data defined by one of four conditions can be stored in one capacitor.

FIG. 9 is a distribution chart of a threshold voltage (Vt) in a state that data is stored in one capacitor by storing electrons therein under one of the four conditions. In FIG. 9, a threshold voltage (Vt) is measured along the horizontal axis. When the threshold voltage is at VtD in a certain area of one capacitor, it is recognized that the area having the threshold voltage VtD is defined by the fourth condition (D). As well, when the threshold voltage is at one of VtC, VtB and VtA in a certain area of one capacitor, it is recognized that the area having the threshold voltage VtC, VtB or VtA is defined one of the first through third conditions (C), (B) and (A).

As described above, data defined by the four conditions can be stored in one of the first and the second capacitors. Since there are two capacitors, the first and second capacitors 240a and 240b, in the sidewall-type memory shown in FIG. 8, data defined by sixteen conditions (16=4×4), which is equal to four-bit information, can be stored without increasing bit lines according to reference (5).

However, according to the semiconductor memory disclosed in reference (5), the bottom of each distribution line is overlapped because of a production tolerance, so that it may be difficult to store data using one of four conditions in each capacitor. For this reason, it is not easy to manufacture a high reliability memory cell, and the fabrication yield goes down.

SUMMARY OF THE INVENTION

An objective of the invention is to solve the above-described problem and to provide a semiconductor memory each cell of which can store at least three-bit information without increasing bit lines. A further objective is to provide a method of writing data into the semiconductor memory.

This objective is achieved by a non-volatile semiconductor memory including a silicon substrate having first and second diffusion layers at its surface and a control gate located above a channel region defined by the first and the second diffusion layers and formed on the silicon substrate. The memory includes first, second and third capacitors are formed on the channel region, respectively under the control gate, on one side of the control gate and the first capacitor and at the opposite side of the control gate and first capacitor.

A further objective is achieved by a method of writing data into such a non-volatile semiconductor memory as described in the following manner: When information is stored at an area in the first capacitor adjacent to the first diffusion layer (a first condition), data is written by (i) applying a ground electric potential to the silicon substrate and the second diffusion layer, and (ii) applying a first positive voltage to the control gate and the first diffusion layer. When information is stored in the second capacitor (a second condition), data is written by (i) applying a ground electric potential to the silicon substrate and the second diffusion layer, and (ii) applying a second positive voltage to the control gate and applying a third positive voltage to the first diffusion layer, wherein the third positive voltage is lower than the second positive voltage. When information is stored at another area in the first capacitor adjacent to the second diffusion layer (a third condition), data is written by (i) applying a ground electric potential to the silicon substrate and the first diffusion layer, and (ii) applying a fourth positive voltage to the control gate and the first diffusion layer. When information is stored in the third capacitor (a fourth condition), data is written by (i) applying a ground electric potential to the silicon substrate and the first diffusion layer, and (ii) applying a fifth positive voltage to the control gate and applying a sixth positive voltage to the second diffusion layer, wherein the sixth positive voltage is lower than the fifth positive voltage.

BRIEF DESCRIPTION OF THE DRAWINGS

The invention will be more particularly described with reference to the accompanying drawings, in which.

DETAILED DESCRIPTION OF THE PREFERRED EMBODIMENTS

Figure 1:
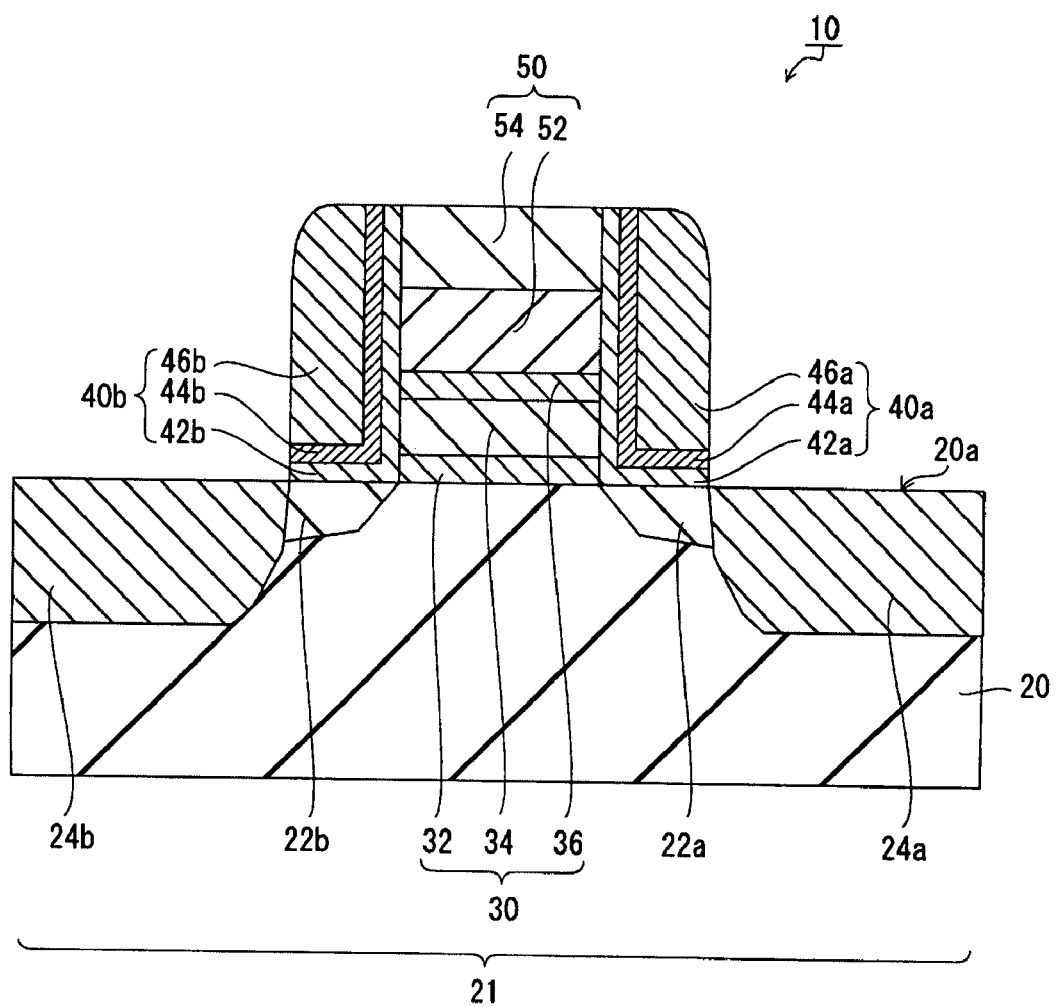
FIG. 1 is a sectional view of a nonvolatile semiconductor memory according to a first embodiment of the invention.

The preferred embodiments of the invention are explained together with drawings as follows. In each drawing, the same reference numbers designate the same or similar components.

First Embodiment

Initially, a first embodiment of the invention is explained with reference to some of the drawings as follows. In the first embodiment, a location or a size of each component in the drawings is schematically illustrated for understanding of the invention only. Further, material and numerical limitations for each component are described by way of preferred examples, so that the scope of the invention is not limited to such materials or numerical limitations. Thus, the scope of the invention is not limited to the following embodiments.

[Structure of the Nonvolatile Semiconductor Memory and the Method of Manufacturing the Same]

Referring to FIG. 1, a nonvolatile semiconductor memory 10 of the first embodiment of the invention includes a semiconductor substrate 20, a first capacitor 30 formed on a main surface 20a of the semiconductor substrate 20, a control gate 50 formed on the first capacitor 30, first and second impurity diffusion layers 24a and 24b formed at the main surface 20a of the semiconductor substrate 20, first and second variable resistive layers 22a and 22b located in an area sandwiched by the first and second impurity diffusion layers 24a and 24b, and second and third capacitors 40a and 40b respectively located at opposite sides of the first capacitor 30. The semiconductor substrate 20 can be made of silicon in the first embodiment, and in the following explanation, a P-type silicon substrate is used, and alternatively an N-type silicon substrate with P type wells may be used.

The nonvolatile semiconductor memory 10 is formed in an active region defined by unillustrated isolation regions in which unillustrated silicon oxide layers are formed by LOCOS (Local Oxidation of Silicon) technology or STI (Shallow Trench Isolation) technology.

The first capacitor 30, which is located in a part of the active region and is formed on the main surface 20a of the semiconductor substrate 20, includes a tunnel oxide layer 32, a capacitor layer 34 formed on the tunnel layer 132 and a top oxide layer 36 formed on the capacitor layer 134. The tunnel oxide layer 32 can be a silicon oxide layer having a 7 nm thickness, manufactured by a thermal oxidation process. The capacitor layer 34 can be a silicon nitride layer having a 6 nm thickness, manufactured by a LPCVD (Low Pressure Chemical Vapor Deposition) process. The top oxide layer 36 can be a silicon oxide layer having a 9 nm thickness, manufactured by the LPCVD process. The control electrode 50 is formed on the first capacitor 30. The control electrode 50 can have a polycide structure, which includes a poly-silicon layer 52 and a metal silicide layer 54 having a 100 nm thickness, such as a tungsten silicide layer, formed on the poly-silicon layer 52. The poly-silicon layer 52 is formed by depositing poly-silicon doped with phosphorus (P) at a concentration of $3 \times 10^{20}/\text{cm}^3$ by CVD. Doping poly-silicon with phosphorus can be performed during or after a step of forming the poly-silicon layer. The metal silicide layer 54 is formed by a spattering process.

At the main surface 20a of the silicon substrate 20, first and second impurity diffusion layers 24a and 24b are formed, and the first and second impurity diffusion layers 24a and 24b sandwiches an area (hereinafter called "a channel region") at the main surface 20a under the control gate 50. Since the first and second impurity diffusion layers 24a and 24b are formed by diffusing highly concentrated N type impurity, such as arsenic (As), these layers 24a and 24b are each defined as $N^+$ diffusion layers. The first and the second impurity diffusion layers 24a and 24b act as a source and a drain of a FET (Field Effect Transistor), respectively. In the following explanation, the first impurity diffusion layer 24a is used as a drain, and the second diffusion layer 24b is used as a source.

The first variable resistive layer 22a is formed in the substrate at its main surface 20a between the drain 24a and the area in the channel region under the control gate 50, and the second variable resistive layer 22b is formed in the substrate at its main surface 20a between the source 24b and the area in the channel region under the control gate 50. In both of the first and second variable resistive layers 22a and 22b, as well as the source and drain 24a and 24b, N-type impurities are diffused. The impurity concentration in each of the first and the second variable resistive layers 22a and 22b is lighter than that of the source and the drain 24a and 24b. Thus, each of the first and the second variable resistive layers 22a and 22b is defined as an $N^-$ diffusion layer, while each of the source 24b and the drain 24a is defined as an $N^+$ diffusion layer. This structure having the source/drain 24a and 24b with the first and the second variable resistive layers 22a and 22b is substantially the same as that of the LDD (Lightly Doped Drain) type MOSFET.

As described above, the nonvolatile semiconductor memory 10 includes the second capacitor 40a formed on the first variable resistive layer 22a, and the third capacitor 40b formed on the second variable resistive layer 22b. The second capacitor 40a includes a tunnel oxide layer 42a, a capacitor layer 44a formed the tunnel oxide layer 42a and a top oxide layer 46a formed on the capacitor layer 44a. The third capacitors 40b is similar to the second capacitor 40a, that is, includes a tunnel oxide layer 42b, a capacitor layer 44b formed the tunnel oxide layer 42b and the top oxide layer 46b formed on the capacitor layer 44b.

The tunnel oxide layers 42a and 42b are formed by a radical oxidation process, such as the ISSG (In-situ Steam Generation) or the SPA (Slot Plane Antenna), and each of the tunnel oxide layers 42a and 42b is formed of a silicon oxide layer having a 7 nm thickness. Each of the capacitor layers 44a and 44b can be a silicon nitride layer having a 6 nm thickness, manufactured by the LPCVD process, and each of the top oxide layers 46a and 46b can be a silicon oxide layer having a 30 nm thickness manufactured by the LPCVD process.

The second and third capacitors 40a and 40b are formed as follows. Initially, a silicon oxide layer, which later will become the tunnel oxide layers 42a and 42b, is formed by the radical oxidation process on the entire main surface 20a of the silicon substrate 20 having the control electrode 50. Then, a silicon nitride layer, which later will become the capacitor layers 44a and 44b, is formed on the oxide layer, and a thick silicon oxide layer, which later will become the top oxide layers 46a and 46b, is formed on the silicon nitride layer. Then, an anisotropic etching process is performed on these three layers (the silicon oxide layer/the silicon nitride layer/ the thick silicon oxide layer). As a result of the anisotropic etching, the second and third capacitors 40a and 40b, which sandwich the control gate 50 in the gate length direction, are formed in a sidewall shape.

The first and the second variable resistive layers 22a and 22b are formed by an ion implanting process using the control gate 50 as a mask. An impurity, which in this embodiment is arsenic, is implanted with a concentration of $1\times10^{13}/cm^2$ into the first and the second variable resistive layers regions. The source 24b and the drain 24a are formed by an ion implantation process using the second and the third capacitors 40a and 40b as a mask. An arsenic impurity also is implanted with a concentration of $1\times10^{15}/cm^2$ into the source and drain regions. After that, an activation annealing is performed for 10 seconds in a nitrogen atmosphere heated to 1000° C.

While the capacitor layers 34, 44a and 44b in the first through third capacitors 30, 40a and 40b are formed from the silicon oxide layer as described above, the material of which they are comprised can be changed to one or a combination of a silicon nitride layer, an oxidized aluminum layer and a hafnium oxide layer.

[Method of Writing Data into the Nonvolatile Semiconductor Memory]

A method of writing date into the nonvolatile semiconductor memory is explained as follows with reference to FIGS. 2A, 2B and 3. Initially, with reference to FIGS. 2A and 2B, a method for storing data in an area of the first capacitor 30 adjacent to the drain 24a is explained.

Figure 2A:
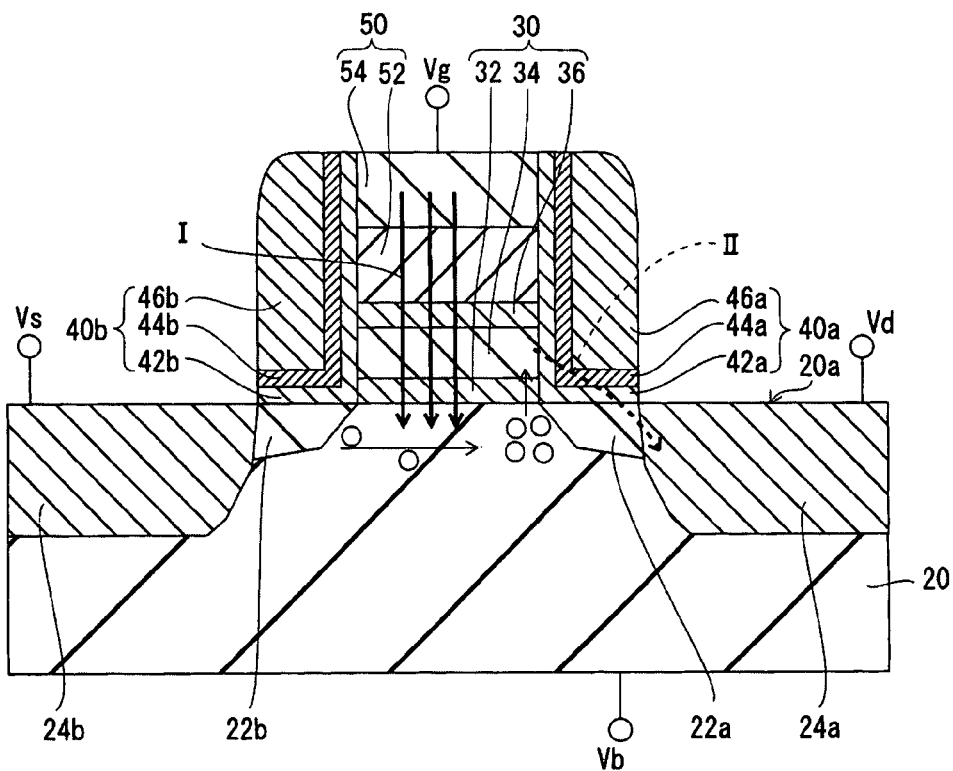
FIG. 2A is a sectional view of a nonvolatile semiconductor memory marked for explaining a method of writing data into a first capacitor located under a control gate according to the first embodiment of the invention.
Figure 2B:
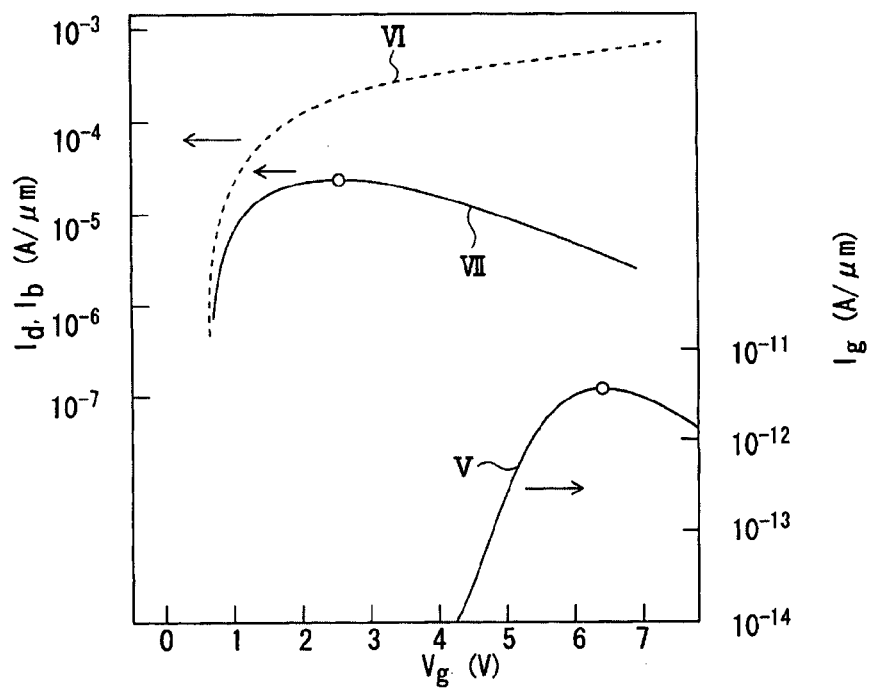
FIG. 2B is a graph showing a relationship among a gate current (Ig) flowed in the control gate, as indicated by the curve V, a drain current (Id) flowed in a drain as indicated by the curve VI, and a source current (Is) flowed in a source as indicated by a curve VII, when a gate voltage applied to the control gate is changed under the condition that a drain voltage applied to the drain is fixed at six (6) volts, according to the first embodiment of the invention.

FIG. 2A is a sectional view of a nonvolatile semiconductor memory, marked to explain a method of writing data into a first capacitor located under a control gate. FIG. 2B is a graph showing a relationship among a gate current (Ig) flowed in the control gate, as indicated by the curve V, a drain current (Id) flowed in a drain, as indicated by curve VI and a source current (Is) flowed in a source, as indicated by curve VII, when a gate voltage applied to the control gate is changed under the condition that a drain voltage applied to the drain is fixed at a six (6) volt. In FIG. 2B, the gate voltage (Vg) is measured along the horizontal axis and the electric current value is measured along the vertical axis.

In order to store data in the first capacitor 30, a ground electric potential (GND) should be applied to the silicon substrate 20 and the source 24b, initially. Then, a positive voltage is applied to the control gate 50 and the drain 24a. At this moment, the value of the positive voltage applied to the control gate 50 is substantially the same as that applied to the drain 24a. In this embodiment, the electric potential (Vb) applied the silicon substrate 20 and the source voltage (Vs) applied to the source 24b is at 0V, and the gate voltage (Vg) applied the control gate 50 and the drain voltage (Vd) applied to the drain 24a is at about six (6) volt (Vs=Vb=0[v], and Vg≈Vd≈6[v]).

Under these conditions, the electrons that have passed through the channel between the source 24b and the drain 24a, are changed to a high energy state near the drain 24a by the strong electric field toward the drain 24a. The electrons in the high energy state collide with atoms of the silicon substrate located near the electrons. As a result of the collisions, electron-hole pairs are generated. The electrons generated in this way, known as "hot electrons", whose potential barrier φB is greater than that (~3.2 eV) at the interface junction between the silicon substrate 20 and the tunnel oxide layer 32 are injected from the gate electrode 50 toward the silicon substrate 20 into an area of the capacitor layer 34 of the first capacitor 30 adjacent to the drain 24a by an electric field, which is illustrated by arrows (I) in FIG. 2A.

According to the first embodiment, since the gate voltage (Vg) is substantially equal to the drain voltage (Vd), the strength of the electric field across the second capacitor 40a, which is illustrated by arrows (II) in FIG. 2, is nearly zero (0) V/cm. Thus, if hot electrons are generated beneath the second capacitor 40a, the hot electrons will not reach to the capacitor layer 44a of the second capacitor 40a. Thus, almost all hot electrons generated are captured in the area of the capacitor layer 34 adjacent to the drain 24a.

In accordance with the first embodiment of the invention, the value of the positive voltage applied to the control gate 50 is substantially the same as that applied to the drain 24a as described, in order not to capture the hot electrons at the capacitor layer 44a in the second capacitor 40a by the electric field across the second capacitor 40a. Thus, it is not always required that the value of the positive voltage applied to the control gate 50 is the same as that applied to the drain 24a if the hot electrons do not reach to the capacitor layer 44a or if the hot electrons, which reach to the capacitor layer 44a, is sufficiently small for data. However, it is preferred that the value of the positive voltage applied to the control gate 50 is substantially the same as that applied to the drain 24a, because the peak value of the gate current (Ig), which flows from the silicon substrate 20 to the control gate 50, is appeared at this condition, that is, Vg≈Vd, as illustrated as the curve (V) in FIG. 2B.

To the contrary, when information is stored in an area of the capacitor layer 34 of the first capacitor 30 adjacent to the source 24b, the voltage applied to the drain 24a as described above is applied to the source 24b, and the voltage applied to the source 24b as described above is applied to the drain 24a.

In other words, a ground electric potential (GND) should be applied to the silicon substrate 20 and the drain 24a, initially. Then, a positive voltage is applied to the control gate 50 and the source 24b wherein the value of the positive voltage applied to the control gate is substantially the same as that applied to the source 24b. As a result, as well as the operation that information is stored in the area of the capacitor layer 34 of the first capacitor 30 adjacent to the drain 24a, information is stored in the area of the capacitor layer 34 of the first capacitor 30 adjacent to the source 24b.

Figure 3:
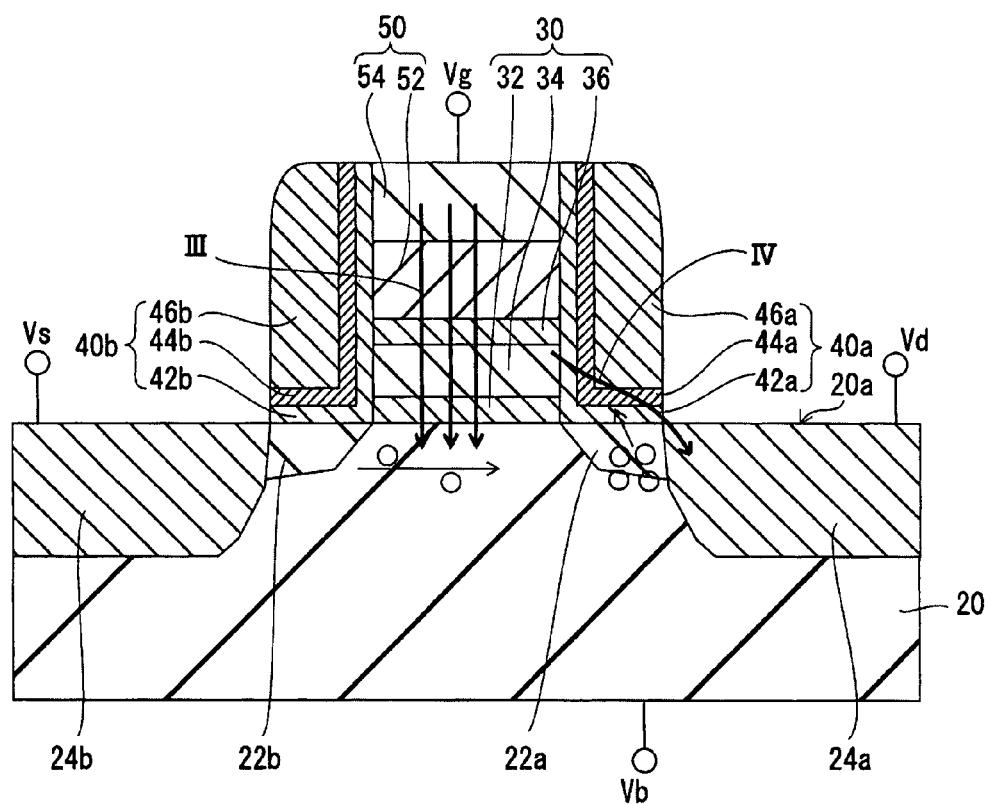
FIG. 3 is a sectional view of a nonvolatile semiconductor memory marked for explaining a method of writing data into a second capacitor located at one side of the control gate, according to the first embodiment of the invention.

Next, with reference to FIG. 3, a method for storing data in the second capacitor 40a is explained. FIG. 3 is a sectional view of a nonvolatile semiconductor memory marked for explaining a method of writing data into a second capacitor located at one side of the control gate.

In order to store data in the second capacitor 40a, a ground electric potential (GND) should be applied to the silicon substrate 20 and the source 24b, initially. Then, by applying a first positive voltage to the control gate 50 and a second positive voltage, which is lower than the first positive voltage, to the drain 24a simultaneously, electric charges are stored in the capacitor layer 44a in the second capacitor 40a. In this embodiment, the electric potential (Vb) applied the silicon substrate 20 and the source voltage (Vs) applied to the source 24b is at 0V, and the gate voltage (Vg) applied the control gate 50 is at about six (6) volts and the drain voltage (Vd) applied to the drain 24a is at about three (3) volt(Vs=Vb=0[v], Vg≈6[v] and Vd≈3[v]).

Under these conditions, the electrons, which passed through in the channel between the source 24b and the drain 24a, are changed in high energy state near the drain 24a by the strong electric field. The hot electrons generated by the electrons in the high energy state are injected into the capacitor layer 44a of the second capacitor 40a by an electric field (IV) across the second capacitor 40a toward the drain 24, which is illustrated by arrows (IV) in FIG. 3.

As described above, since the gate voltage (Vg) is set larger than the drain voltage (Vd), the electric field (IV) across the second capacitor 40a from the control gate 50 toward the drain 24 is generated. Thus, the hot electrons generated under the second capacitor 40a are injected into the capacitor layer 44a of the second capacitor 40a. Moreover, compared with the drain voltage at the injection of the electrons into the first capacitor 30, the drain voltage is set lower in order to store electrons in the second capacitor 40a so that the hot electrons are generated in an area close to the drain 24a. In other words, the hot electrons are generated in the area, which is located far from the control gate 50. Accordingly, the hot electrons are not influenced by the electric field, which is illustrated by arrows (III) in FIG. 3, from the gate electrode 50 toward the silicon substrate 20. For this reason, the electrons are injected into and captured at the capacitor layer 44a of the second capacitor 40a, effectively.

In the embodiment, the value of the gate voltage (Vg) is twice as that of the drain voltage (Vd) as preferred. However, if the gate voltage (Vg) is set higher than the drain voltage, the similar efface can be expected. Thus, the gate voltage (Vg) and drain voltage can be selected at a desired value, respectively in the range that satisfies the equation "Vg>Vd".

Next, in order to store data in the third capacitor 40b, the voltage applied to the drain 24a as described above is applied to the source 24b, and the voltage applied to the source 24b as described above is applied to the drain 24a. In other words, a ground electric potential (GND) should be applied to the silicon substrate 20 and the drain 24a, initially. Then, by applying a first positive voltage to the control gate 50 and a second positive voltage, which is lower than the first positive voltage, to the source 24b simultaneously, electric charges are stored in the capacitor layer 44a in the third capacitor 40b.

[Method of Reading-Out Date Stored in the Nonvolatile Semiconductor Memory]

There are two memorable regions in an area adjacent to the source 24b; the first memorable regions is located in the area of the first capacitor 30 adjacent to the source 26b and the second memorable region is the third capacitor 40b. The following explanation is a method of reading-out date from these two memorable regions.

In order to read-out data, a ground electric potential (GND) should be applied to the silicon substrate 20 and the source 24b, initially. Then, a positive voltage is applied to the control gate 50 and the drain 24a. Although the positive voltage can be set at a desired value, it is required that the value of the positive voltage applied to the control gate 50 be set lower than that at the time of writing data in order to avoid injecting electrons into the first, the second and the third capacitors 30, 40a and 40b at the read-out operation.

Figure 4:
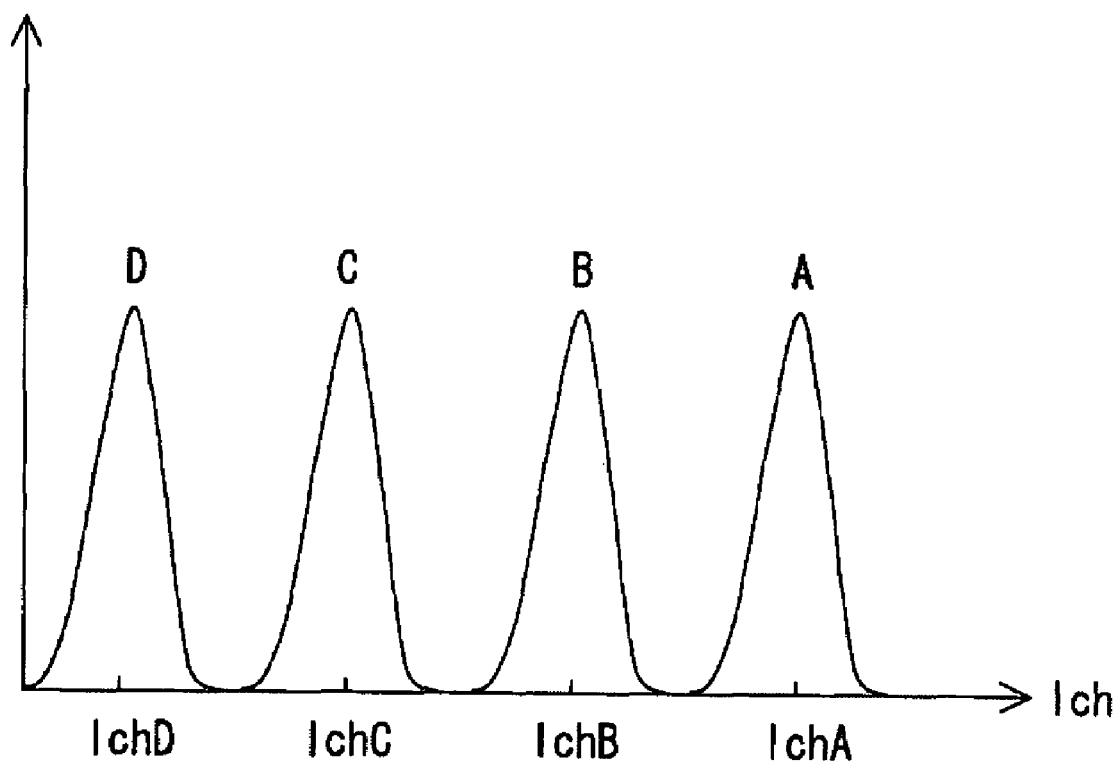
FIG. 4 is a distribution chart of channel currents (IchA~IchD) under the condition that information is stored by the first capacitor and an area of a third capacitor adjacent to the source.

FIG. 4 a distribution chart of channel currents (IchA~IchD) under the condition that information is stored by the first capacitor 30 and an area of a third capacitor 40b adjacent to the source 24b where the channel current (Ich) is measured along the horizontal axis.

The channel resistance between the source 24b and drain 24a is changed by the state on whether or not electrons are stored in the area of the first capacitor 30 adjacent to the source 24b and in the third capacitor 40b. In other words, the channel resistance is determined by following four conditions.

The first condition (A) is that there are no electrons stored in both the area of the first capacitor adjacent to the source 24b and the third capacitor 40b. The second condition (B) is that electrons are stored only in the area of the first capacitor 30 adjacent to the source 24b. The third condition (C) is that electrons are stored only in the third capacitor 40b. The fourth condition (D) is that electrons are stored both in the area of the first capacitor 30 adjacent to the source 24b and the third capacitor 40b. Thus, the channel current (Ich) between the source 24b and the drain 24a varies, depending on the four conditions of data stored. As a result, it is possible to find out the condition of the single memory cell by measuring the channel current (Ich) between the source 24b and the drain 24a.

[Method of Erasing Date Stored in the Nonvolatile Semiconductor Memory]

The following explanation is a method of erasing date stored in the first, the second and the third capacitors 30, 40a, and 40b.

When the data stored in the second and the third capacitors 40a and 40b, a ground electric potential (GND) is applied to the silicon substrate 20, a negative voltage like −6 V is applied to the control gate 50, and a positive voltage like 6V is applied to the source 24b and the drain 24a. Under this condition, holes are injected by the tunnel effect so that the electrons are neutralized with the holes, namely, the data are erased.

In the case of erasing the data stored in the first capacitor 30, while a positive voltage like 8V is applied to the silicon substrate 20, the source 24b and the drain 24a, a ground electric potential (GND) is applied to the control gate 30. Under this condition, the electric charge stored in the first capacitor is pulled by the silicon substrate 20 to which the positive voltage is applied. As a result, the data is erased.

[Another Method of Writing Date into the Nonvolatile Semiconductor Memory]

Figure 5:
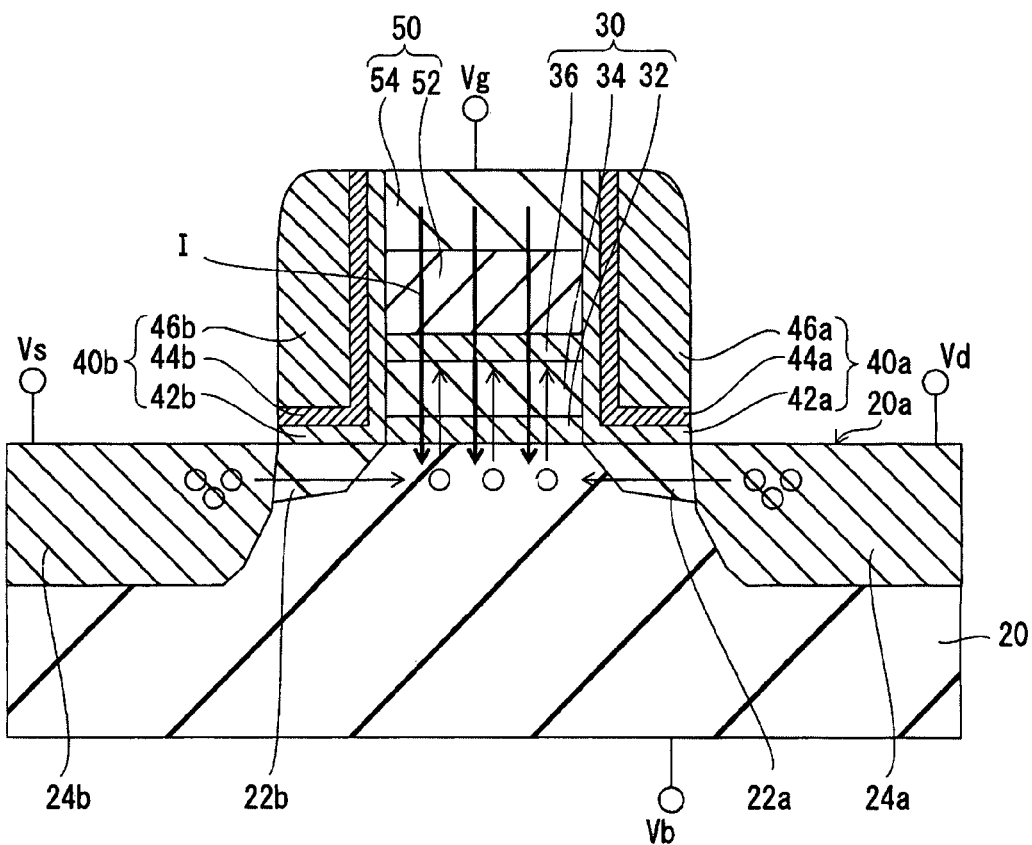
FIG. 5 is a sectional view of a nonvolatile semiconductor memory marked for explaining another method of writing data into a first capacitor located under a control gate, according to the first embodiment of the invention.

With reference to FIG. 5, another method of writing date into the nonvolatile semiconductor memory is explained below. FIG. 5 is a sectional view of a nonvolatile semiconductor memory marked for explaining another method of writing data into a first capacitor located under a control gate. It is noted that the processes of writing data into the second and third capacitor 40a and 40b in another method are the same as those described above with reference to FIG. 3 so that the explanation is omitted.

In order to store data in the first capacitor 30, a ground electric potential (GND) should be applied to the silicon substrate 20, the source 20b and the drain 24a, initially. Then a positive voltage having a 10 to 15 voltage (V) is applied to the control gate 50.

Under these conditions, electrons are injected into the capacitor layer 34 of the first capacitor 30 by an FN (Fowler-Nordheim) current, Under this method, namely under using the FN current for injecting the electrons, the electron is injected into the entire capacitor layer 34 of the first capacitor 30 uniformity. As a result, three-bit information can be stored in one cell of the semiconductor memory According to the nonvolatile semiconductor memory of the first embodiment of the invention, one memory cell includes three memorable regions, such as the first, the second and the third capacitors 30, 40a and 40b, and specifically, the first capacitor may include two memorable regions, wherein one is located at the area in the capacitor layer 34 adjacent to the drain 24a, another is located in the area of the capacitor layer 34 adjacent to the source 24b. Thus, the nonvolatile semiconductor memory of the first embodiment of the invention may have three or four memorable regions in a single cell, and specifically, it is clear to detect the conduction in each memorable region as to whether or not data is stored therein.

As a result, compared with the semiconductor memory disclosed in the reference (5) referred in Background of Invention, which detects one of four the conditions in response to the amount of the electrons stored in the one layer, it is possible to suppress the deterioration of the fabrication yield based on a production tolerance because the detection of the conditions can be made in response to the location where electron is stored, not the amount of the electrons stored in one layer.

Moreover, according to the first embodiment of the invention, the locations where electrons should be injected, can be controlled by the conditions, each of which is determined by the voltages applied to the control gate 30, the source 24a and the drain 24b. Thus, only two it-lines are required to control for each memory cell. As a result, the configuration of the metalized lines may not be complicated.

Second Embodiment

Figure 6:
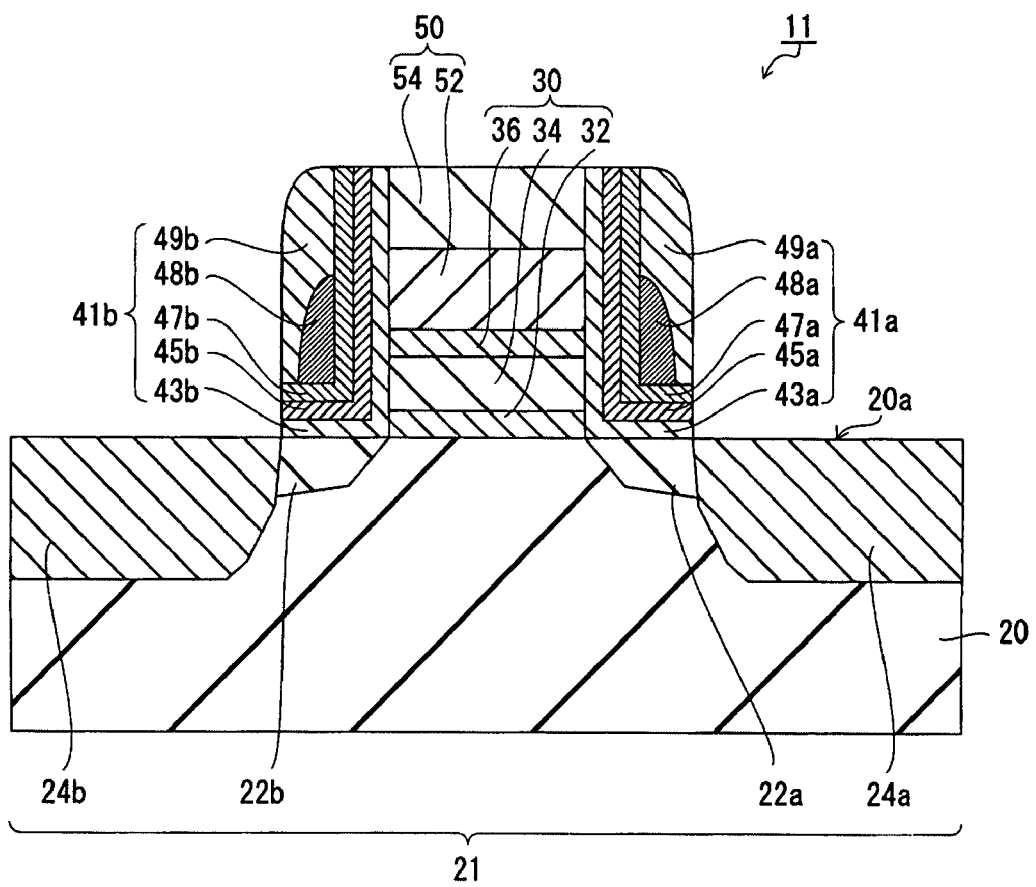
FIG. 6 is a sectional view of a nonvolatile semiconductor memory according to a second embodiment of the invention.
Figure 7:
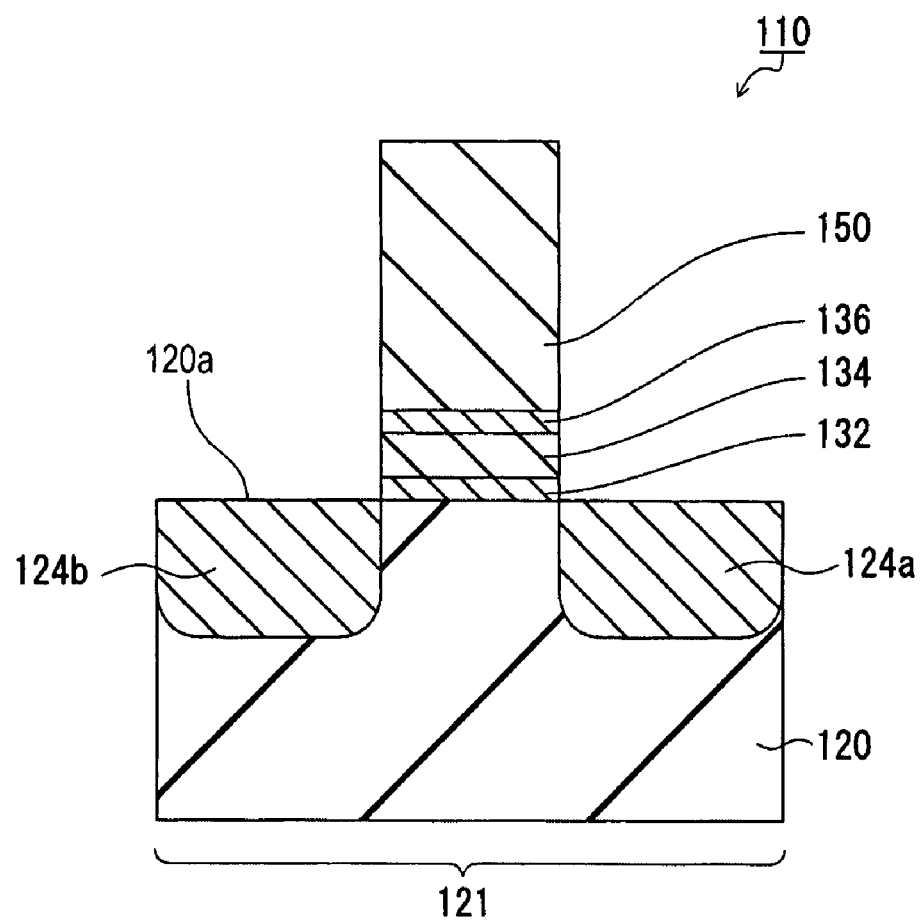
FIG. 7 is a sectional view of a conventional SONOS type nonvolatile semiconductor memory.
Figure 8:
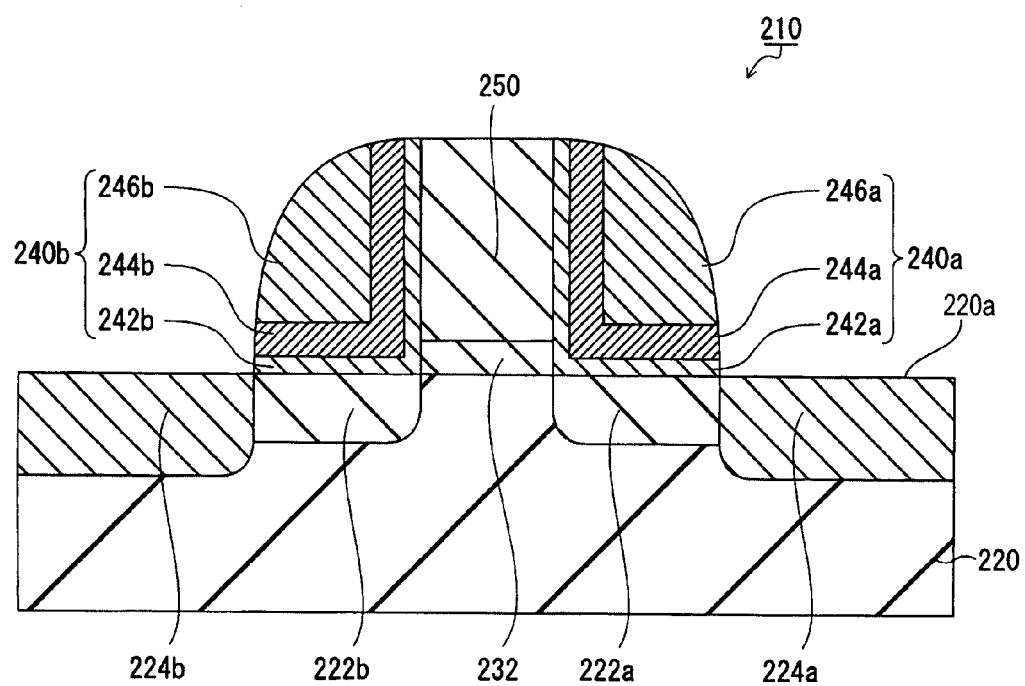
FIG. 8 is a sectional view of a conventional sidewall-type nonvolatile semiconductor memory.
Figure 9:
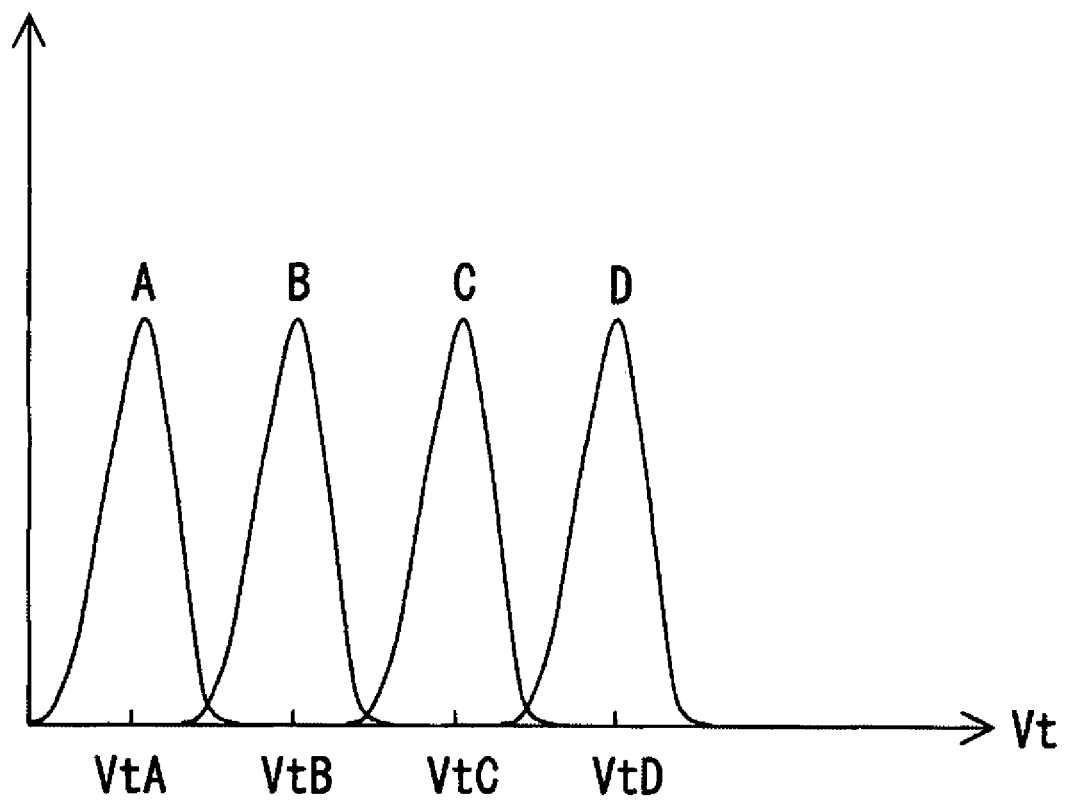
FIG. 9 is a distribution chart of a threshold voltage (Vt) when data is stored in one capacitor under the four conditions.

With reference to FIG. 6, a nonvolatile semiconductor memory according to the SECOND embodiment of the invention is explained as follows. FIG. 6 is a sectional view of a nonvolatile semiconductor memory, according to a second embodiment of the invention The nonvolatile semiconductor memory 11, according to the second embodiment, includes a fourth capacitor 41a and a fifth capacitor 41b, instead of the second capacitor 40a and the third capacitor 40b. Other components of the nonvolatile semiconductor memory 11 are the same as those used in the nonvolatile semiconductor memory 10 of the first embodiment. Thus, in sake of the brevity, the explanation of the second embodiment is focused on the fourth capacitor 41a and the fifth capacitor 41b, and the explanation of the other components disclosed in the first embodiment is omitted below.

The fourth and the fifth capacitors 40a and 40b, each of which is located at the one of the sides of the first capacitor 30, have a following structure, respectively. The fourth capacitor 41a is formed on the first variable resistive layer 22a, and a fifth capacitor 41b is formed on the second variable resistive layer 22b. The fourth capacitor 41a includes a tunnel oxide layer 43a, a capacitor layer 45a formed the tunnel oxide layer 43a and the top oxide layer 47a formed on the capacitor layer 45a. The fifth capacitors 41b is a similar to the fourth capacitor 41a, that is, includes a tunnel oxide layer 43b, a capacitor layer 45b formed the tunnel oxide layer 43b and the top oxide layer 47b formed on the capacitor layer 45b. The tunnel oxide layers 43a and 43b are formed by a radical oxidation process, such as the ISSG or the SPA, and each of the tunnel oxide layers 43a and 43b formed of a silicon oxide layer having a 7 nm thickness. Each of the capacitor layers 45a and 45b can be a silicon nitride layer having a 6 nm thickness manufactured by LPCVD process, and each of the top oxide layers 47a and 47b can be a silicon oxide layer having a 9 nm thickness manufactured by LPCVD process. Thus, a combination of these three layers 43a, 45a, and 47a or 43b, 45b, and 47b has a charge-storable structure, and is called an ONO (Oxide/Nitride/Oxide) insulator.

Each of the fourth capacitor 41a and the fifth capacitor 41b further includes a flouting gate 48a or 48b formed on the top oxide layer 47a or 47b, and a sidewall oxide layer 49a or 49b covering the flouting gate 48a or 48b. The flouting gates 48a and 48b having 30 nm thickness, respectively, are formed by depositing poly-silicon doped with phosphorus (P) at concentration of $3 \times 10^{20}/cm^3$ by CVD. The sidewall oxide layers 4a and 49b can be a silicon oxide layer having a 30 nm thickness manufactured by LPCVD process as well as the process for forming the top oxide layer 47a and 47b.

According to the second embodiment of the invention, each of the fourth and the fifth capacitor 41a and 41b has the built-in flouting gate 48a or 48b. Thus, an electric field across the capacitor layer 45a or 45b of the fourth or fifth capacitor 41a or 41b is generated between the silicon substrate 20 and the flouting gate 48a or 48b by coupling capacitors caused by the voltage applied to the control gate 30.

The voltage (Vf) applied to the flouting gate 48a or 48b becomes smaller than the voltage (Vg) applied to the control gate 30, that is, "Vg>Vf" because of the capacitor coupling. Thus, when the gate voltage (Vg) and the drain voltage (Vd) are selected in the range of the equation of "Vg>Vf>Vd", the electrons are injected into the capacitor layer 45a or 45b effectively by the electric field generated from the control electrode 30 toward the silicon substrate 20.

The electrons can be injected into the capacitor layer 34 at the first capacitor 30 selectively by the following process. Initially, the voltage (Vf) applied to the flouting gate 48a is set at lower than the voltage (Vd) applied to the drain 24a, that is "Vd>Vf" so that the electric field across the capacitor layer 45a of the fourth capacitor 41a is generated from the silicon substrate 20 toward the control electrode 30. As a result, electrons are not injected into either capacitor layer 45a or 45b of the fourth or the fifth capacitors 41a or 41b. Thus, the electrons can be injected into the capacitor layer 34 at the first capacitor 30 selectively.

While the invention has been described with reference to illustrative embodiments, this description is not intended to be construed in a limiting sense. Thus, shapes, size and physical relationship of each component are roughly illustrated so the scope of the invention should not be construed to be

What I claim is:

1. A non-volatile semiconductor memory including a silicon substrate having first and second diffusion layers at its surface and a control gate above a channel region defined by the first and the second diffusion layers and formed on the silicon substrate, comprising:
   a first capacitor located under the control gate and formed on the channel region;
   a second capacitor located at one side of the control gate and the first capacitor and formed on the channel region of the silicon substrate; and
   a third capacitor located at another side of the control gate and the first capacitor and formed on the channel region.

2. A non-volatile semiconductor memory as claimed in claim 1, wherein the first capacitor includes a first insulating layer, a second insulating layer and a third insulating layer.

3. A non-volatile semiconductor memory as claimed in claim 2, wherein the first insulating layer is a first oxide layer formed directly on the substrate, the second insulating layer is a nitride layer formed directly on the first oxide layer and the third insulating layer is a second oxide layer formed directly on the nitride layer.

4. A non-volatile semiconductor memory as claimed in claim 1, wherein the second capacitor includes a first insulating layer, a second insulating layer and a third insulating layer and the third capacitor includes a first insulating layer, which is the same martial and has substantially the same thickness of the first insulating layer of the second capacitor, a second insulating layer, which is the same martial and has substantially the same thickness of the second insulating layer of the second capacitor, and a third insulating layer, which is the same martial and has substantially the same thickness of the third insulating layer of the second capacitor.

5. A non-volatile semiconductor memory as claimed in claim 4, wherein the first insulating layers are first oxide layers formed on the surfaces of the silicon substrate, the first capacitor and the control gate, the second insulating layers are nitride layers formed directly on the first oxide layers and the third insulating layers are second oxide layers formed directly on the nitride layers.

6. A non-volatile semiconductor memory as claimed in claim 1, further including first and second variable resistive layers, each of which is formed in the channel region, whereby each of the second and the third capacitors are formed on one of the first and a second variable resistive layers.

7. A non-volatile semiconductor memory as claimed in claim 6, wherein the conductivity type of the first and the second variable resistive layers is the same as that of the first and the second diffusion layers.

8. A non-volatile semiconductor memory as claimed in claim 7, wherein an impurity concentration of the first and the second variable resistive layers is lower than that of the first and the second diffusion layers.

9. A non-volatile semiconductor memory as claimed in claim 4, wherein the second capacitor further includes a first flouting gate formed on the insulating layer including the first through third insulating layers, and a first sidewall oxide layer covering the first flouting layer, and the third capacitor further includes a second flouting gate formed on the insulating layer including the first through third insulating layers, and a second sidewall oxide layer covering the second flouting layer.

10. A non-volatile semiconductor memory as claimed in claim 9, wherein the first insulating layers are first oxide layers formed on the surfaces of the silicon substrate, the first capacitor and the control gate, the second insulating layers are nitride layers formed directly on the first oxide layers and the third insulating layers are second oxide layers formed directly on the nitride layers.

11. A non-volatile semiconductor memory as claimed in claim 4, further including first and second variable resistive layers, each of which is formed in the channel region, whereby each of the second and the third capacitors are formed on one of the first and a second variable resistive layers.

12. A non-volatile semiconductor memory as claimed in claim 11, wherein the conductivity type of the first and the second variable resistive layers is the same as that of the first and the second diffusion layers.

13. A non-volatile semiconductor memory as claimed in claim 12, wherein an impurity concentration of the first and the second variable resistive layers is lower than that of the first and the second diffusion layers.

14. A method of writing data into a non-volatile semiconductor memory including a silicon substrate having first and second diffusion layers at its surface, and a control gate above a channel region defined by the first and the second diffusion layers and formed on the silicon substrate, a first capacitor located under the control gate and formed on the channel region, a second capacitor located at one side of the control gate and the first capacitor and formed on the channel region, and a third capacitor located at another side of the control gate and the first capacitor and formed on the channel region, comprising:
   (a) when information is stored at an area in the first capacitor adjacent to the first diffusion layer as a first condition,
      (i) applying a ground electric potential to the silicon substrate and the second diffusion layer, and
      (ii) applying a first positive voltage to the control gate and the first diffusion layer;
   (b) when information is stored in the second capacitor as a second condition,
      (i) applying a ground electric potential to the silicon substrate and the second diffusion layer, and
      (ii) applying a second positive voltage to the control gate and applying a third positive voltage to the first diffusion layer, wherein the third positive voltage is lower than the second positive voltage;
   (c) when information is stored at another area in the first capacitor adjacent to the second diffusion layer as a third condition,
      (i) applying a ground electric potential to the silicon substrate and the first diffusion layer, and
      (ii) applying a fourth positive voltage to the control gate and the first diffusion layer; and
   (d) when information is stored in the third capacitor as a fourth condition,
      (i) applying a ground electric potential to the silicon substrate and the first diffusion layer, and
      (ii) applying a fifth positive voltage to the control gate and applying a sixth positive voltage to the second diffusion layer, wherein the sixth positive voltage is lower than the fifth positive voltage.

15. A method of writing data into a non-volatile semiconductor memory as claimed on claim 14, wherein the first positive voltage under the first condition applied to the control gate is equal to the first positive voltage applied to the first diffusion layer, and the fourth positive voltage under the third condition applied to the control gate is equal to the fourth positive voltage applied to the second diffusion layer.

16. A method of writing data into a non-volatile semiconductor memory as claimed on claim 14, wherein the first positive voltage under the first condition applied to the control gate is not equal to the first positive voltage applied to the first diffusion layer, and the fourth positive voltage under the third condition applied to the control gate is not equal to the fourth positive voltage applied to the second diffusion layer.

17. A method of writing data into a non-volatile semiconductor memory as claimed on claim 14, wherein the first positive voltage under the first condition applied to the control gate is equal to the first positive voltage applied to the first diffusion layer, and the fourth positive voltage under the third condition applied to the control gate is not equal to the fourth positive voltage applied to the second diffusion layer.

18. A method of writing data into a non-volatile semiconductor memory as claimed on claim 14, wherein the first positive voltage under the first condition applied to the control gate is not equal to the first positive voltage applied to the first diffusion layer, and the fourth positive voltage under the third condition applied to the control gate is equal to the fourth positive voltage applied to the second diffusion layer.

19. A method of writing data into a non-volatile semiconductor memory including a silicon substrate having first and second diffusion layers at its surface and a control gate above a channel region defined by the first and second diffusion layers and formed on the silicon substrate, a first capacitor being located under the control gate and formed on the channel region, a second capacitor located at one side of the control gate and the first capacitor and formed on the channel region and a third capacitor located at another side of the control gate and the first capacitor and formed on the channel region, comprising:
   (a) when information is stored in the first capacitor as a first condition,
      (i) applying a ground electric potential to the silicon substrate, the first diffusion layer and the second diffusion layer, and
      (ii) applying a first positive voltage to the control gate;
   (b) when information is stored in the second capacitor as a second condition,
      (i) applying a ground electric potential to the silicon substrate and the second diffusion layer, and
      (ii) applying a second positive voltage to the control gate and applying a third positive voltage to the first diffusion layer, wherein the third positive voltage is lower than the second positive voltage; and
   (c) when information is stored in the third capacitor as a third condition,
      (i) applying a ground electric potential to the silicon substrate and the first diffusion layer, and
      (ii) applying a fourth positive voltage to the control gate and applying a fifth positive voltage to the second diffusion layer, wherein the fifth positive voltage is lower than the fourth positive voltage.

20. A method of writing data into a non-volatile semiconductor memory including a silicon substrate having a first and second diffusion layers at its surface and a control gate located above a channel region defined by the first and the second diffusion layers and formed on the silicon substrate, a first capacitor being located under the control gate and formed on the channel region of the silicon substrate, a second capacitor, which includes a first floating gate, located at one side of the control gate and the first capacitor and formed on the channel region and a third capacitor, which includes a first floating gate, located at another side of the control gate and the first capacitor and formed on the channel region, comprising:
   (a) when information is stored in the first capacitor as a first condition, applying a voltage to the first and second floating gates, which is lower than a drain voltage;
   (b) when information is stored in the second capacitor as a second condition, applying a voltage to the first floating gate, which is higher than a drain voltage, and is lower than the control gate voltage; and
   (c) when information is stored in the third capacitor as a third condition, applying a voltage to the second floating gate, which is higher than a drain voltage, and is lower than the control gate voltage.

* * * * *